United States Patent
Lin et al.

[11] Patent Number: 6,048,771
[45] Date of Patent: Apr. 11, 2000

[54] SHALLOW TRENCH ISOLATION TECHNIQUE

[75] Inventors: Tony Lin, Kaohsiung Hsien; Wen-Kuan Yeh, Chupei; Juan-Yuan Wu, Hsinchu, all of Taiwan

[73] Assignee: United Microelectronics Corp., Hsinchu, Taiwan

[21] Appl. No.: 09/085,207

[22] Filed: May 27, 1998

[30] Foreign Application Priority Data

Apr. 27, 1998 [TW] Taiwan ................... 87106429

[51] Int. Cl.⁷ .................. H01L 21/336; H01L 21/76; H01L 21/461
[52] U.S. Cl. ............... 438/296; 438/424; 438/692
[58] Field of Search .................. 438/424, 296, 438/692

[56] References Cited

U.S. PATENT DOCUMENTS 5,721,173  2/1998  Yano et al. .
5,906,297  9/1999  Saki .
5,968,842  10/1999  Hsiao .
5,994,201  11/1999  Lee .

Primary Examiner—John F. Niebling
Assistant Examiner—Josetta Jones
Attorney, Agent, or Firm—Thomas, Kayden, Horstemeyer & Risley

[57] ABSTRACT

A method of forming a shallow trench isolation structure includes etching a substrate to form a trench. Then, an oxide layer is deposited in the trench and over the substrate by using high-density plasma. The oxide layer is pointed since it is formed by high-density plasma chemical vapor deposition. A stop layer made of silicon nitride, silicon oxynitride or boron nitride is formed on the oxide layer. The hardness of the stop layer is higher than that of the oxide layer so the protuberance of the oxide layer will be first removed during chemical mechanical polishing.

19 Claims, 4 Drawing Sheets

SHALLOW TRENCH ISOLATION TECHNIQUE

CROSS-REFERENCE TO RELATED APPLICATION

This application claims the priority benefit of Taiwan application Ser. No. 87,106,429, filed Apr. 27, 1998, the full disclosure of which is incorporated herein by reference.

BACKGROUND OF THE INVENTION

1. Field of the Invention

The invention relates in general to the fabrication of semiconductor integrated circuits (ICs), and more particularly to a method of fabricating shallow trench isolation (STI) structures.

2. Description of the Related Art

A device isolation structure is designed for preventing carrier movement between adjacent devices. Typically, device isolation regions are formed in ICs with high density. For example, device isolation regions can be formed between two adjacent field effect transistors (FET) in a dynamic random access memory (DRAM) to avoid leakage current. One of the common used methods for forming device isolation regions is local oxidation (LOCOS). The LOCOS technique is getting mature. By LOCOS technique, reliable, effective and low-cost device isolation structures can be obtained. However, the conventional LOCOS technique suffers from the problems of stress and bird's effect at the surroundings of the isolation structures. The formation of bird's effect, especially, causes ineffective isolation for a small size device. Therefore, a shallow trench isolation structure (STI) is necessarily applied in high-density devices instead of using LOCOS techniques.

The conventional shallow trench isolation technique uses silicon nitride as a hard mask. Sharp trenches are then defined on the semiconductor substrate by anisotropic etching. Then, silicon oxide is filled in the trenches to form isolation structures.

FIG. 1A to FIG. 1C are the cross-section views showing a conventional process of fabricating a shallow trench isolation structure. Referring first to FIG. 1A, on a substrate 100, a pad oxide layer 102 is formed to protect the substrate surface. Then, a silicon nitride layer 104 is formed by chemical vapor deposition (CVD). Next, on the silicon nitride layer 104, a patterned photoresist layer 105 is formed to define the trench.

Next, referring to FIG. 1B, using the photoresist layer 105 as an etching mask, the silicon nitride layer 104, pas oxide layer 102 and the substrate 100 are etched to form the trench 106 and the trench 108. The photoresist layer 105 is then removed.

Next, referring to FIG. 1C, on the substrate 100, a silicon oxide layer 110 is formed to cover the silicon nitride layer 104 and to fill the trench 106 and the trench 108. The silicon oxide layer 110 can be, for example, a TEOS oxide layer formed by atmospheric pressure chemical vapor deposition (APCVD), using tetra-ethyl-ortho-silicate (TEOS) as gas source.

Next, referring to FIG. 1D, the silicon oxide layer 110 on the silicon nitride layer 104 is removed by chemical mechanical polishing (CMP) so that silicon oxide 114 and silicon oxide 116 are left in the trench 106.

Then, referring to FIG. 1E, the silicon nitride layer 104 is first removed by hot phosphoric acid. Through hydrofluoric acid soaking, the pad oxide layer 102 is removed to form isolation region 114a and isolation region 116a.

However, the above-mentioned shallow trench isolation technique has a few problems as applied in high integration IC. During the process of polishing the TEOS oxide layer 110 by CMP, particles in the slurry makes the surfaces of the oxide layer 114 and the oxide layer 116 form a lot of scratches 140, as shown in FIG. 1D. Further, during the subsequent process of hydrofluoric acid soaking, the scratches 140 are eroded to form microcrack 140a. Referring to FIG. 1E, if scratches 140 are formed on the oxide layer 110 in the small trench 116 during polishing, after the hydrofluoric acid soaking, the conductive layers formed on the two sides of the isolation regions 116a will suffer from the problem of bridging.

Using CMP also has another problem. Over-polishing is necessary to completely polish away the silicon oxide layer 110 on the silicon nitride layer 104. However, over-polishing has a great effect on the wider trench 106. Over-polishing causes the formation of concave in the wider trench, which is so-called "dishing effect".

SUMMARY OF THE INVENTION

It is therefore an object of the invention to provide a method of forming a shallow trench isolation structure without the problems of dishing effect and microcrack.

It is another object of the invention to provide a method of forming a shallow trench isolation structure including first etching a substrate to form a trench. Then, an oxide layer is deposited in the trench and over the substrate by using high-density plasma. The oxide layer is pointed since it is formed by high-density plasma chemical vapor deposition. A stop layer made of silicon nitride, silicon oxy-nitride or boron nitride is formed on the oxide layer. The hardness of the stop layer is higher than that of the oxide layer so the protuberance of the oxide layer will be first removed during chemical mechanical polishing.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIG. 2A to FIG. 2E are cross-sectional views showing the process steps of fabricating a shallow trench isolation structure according to a preferred embodiment of the invention. First, referring to FIG. 2A, a pad oxide layer 202 is formed on a substrate 200 to protect the substrate surface. The preferred material of the substrate 200 is silicon. Then, a mask layer 204 is formed on the pad oxide layer 202. Preferably, the mask layer 204 includes silicon nitride and formed by chemical vapor deposition. Next, a photoresist layer 205 having a pattern is formed on the mask layer 204. The photoresist layer 205 is used for defining the trenches.

Figure 1A:
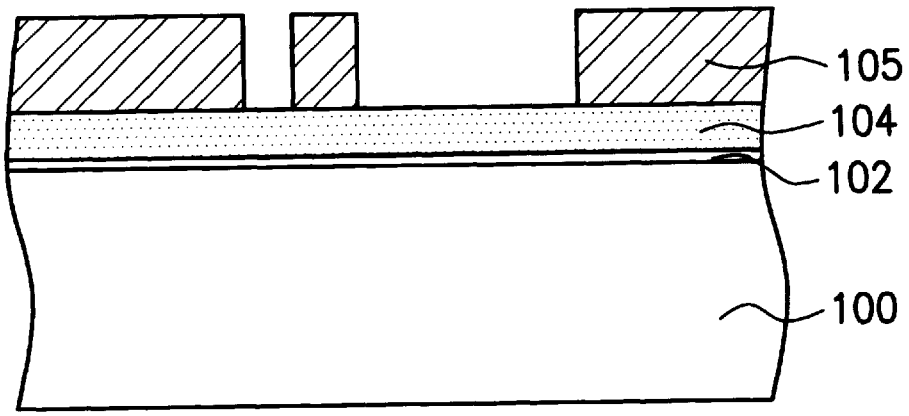
FIG. 1A to FIG. 1E show the process of fabricating a conventional shallow trench isolation structure.
Figure 1B:
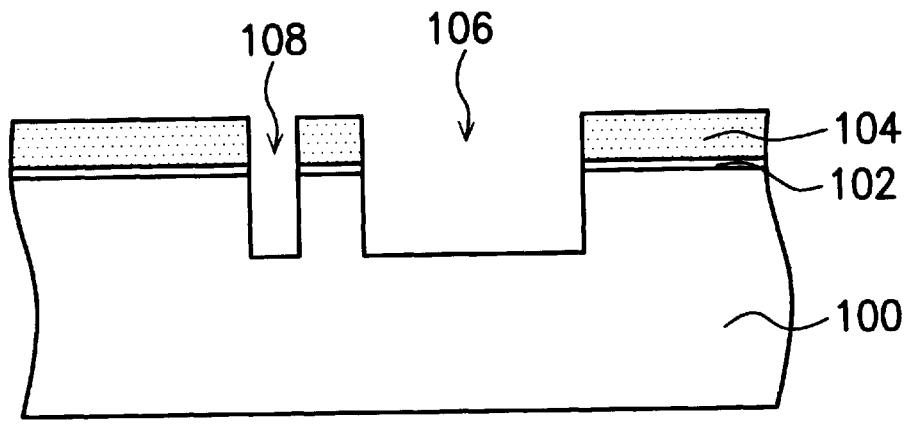
Figure 1C:
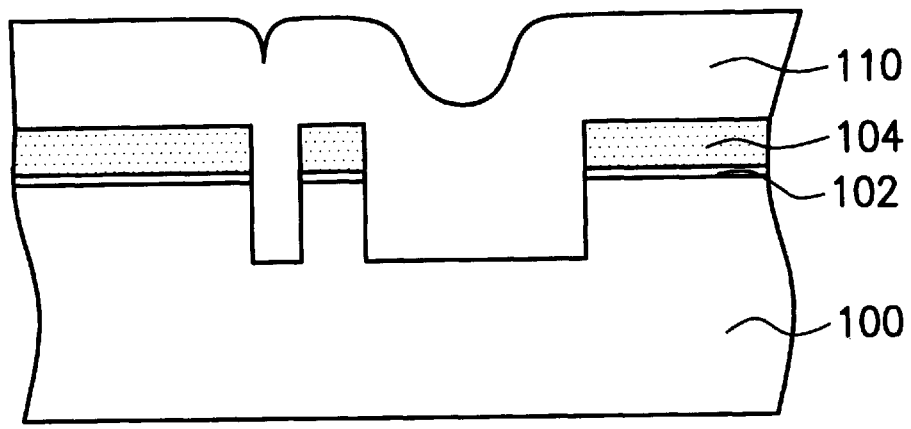
Figure 1D:
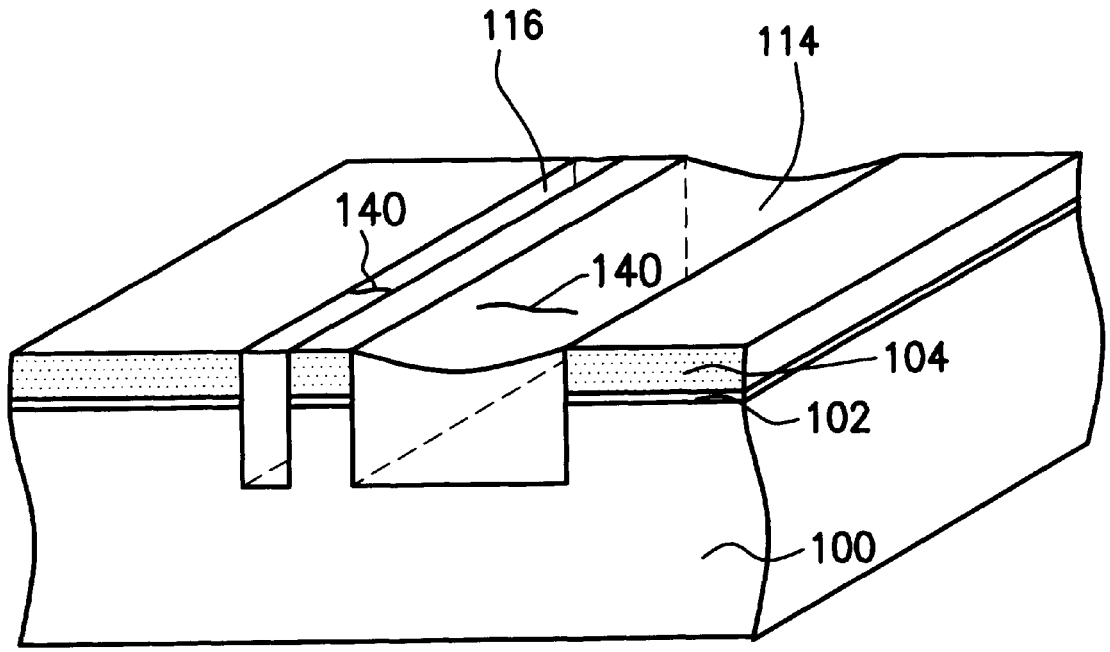
Figure 1E:
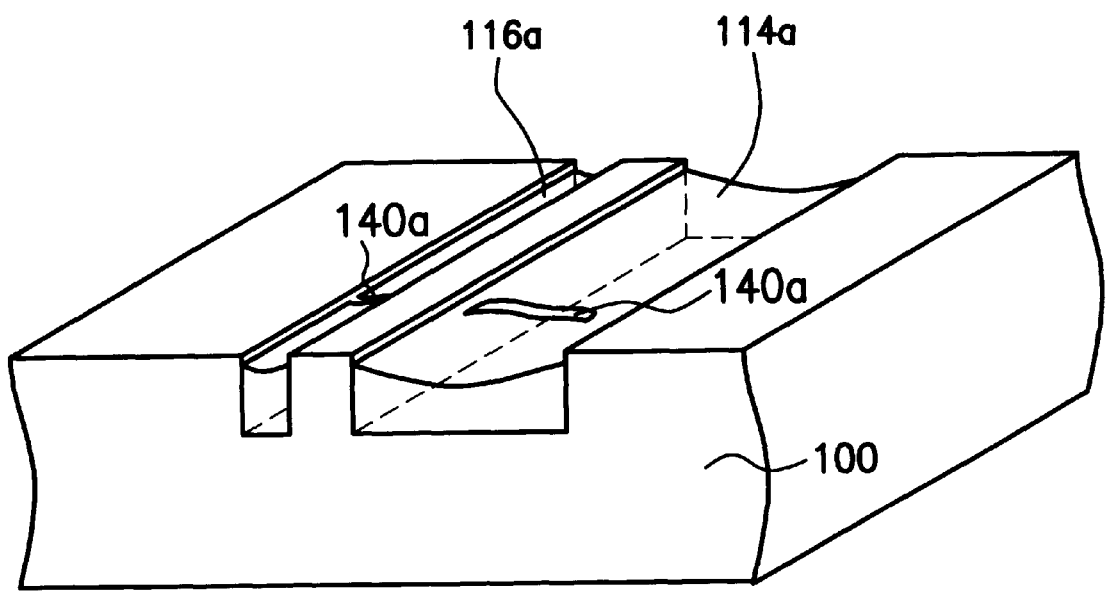
Figure 2A:
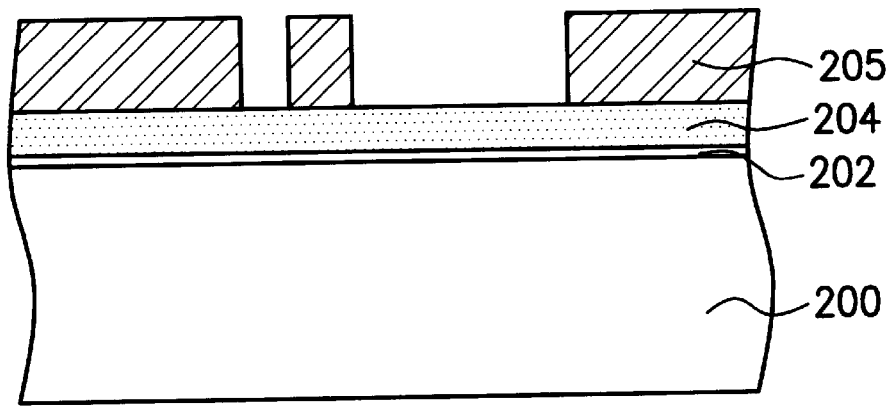
FIG. 2A to FIG. 2E are cross-sectional views showing the process steps of fabricating a shallow trench isolation structure according to a preferred embodiment of the invention.
Figure 2B:
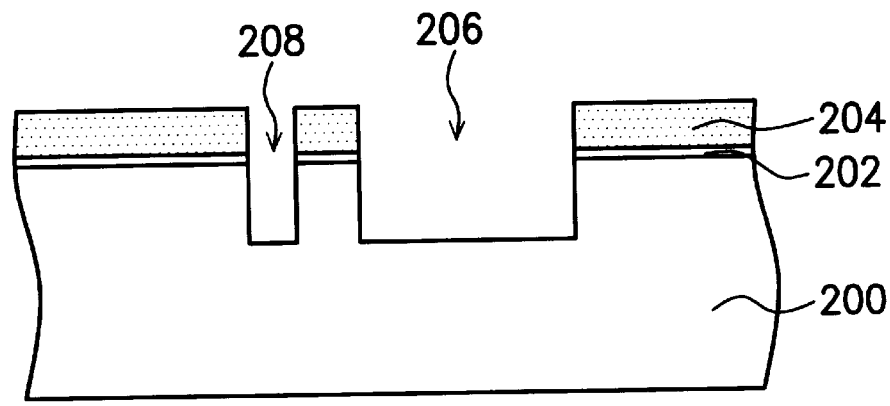

Next, referring to FIG. 2B, using the photoresist layer 205 as an etching mask, the mask layer 204, the pad oxide layer 202 and the substrate 100 are etched to form a trench 206 and a trench 208. Then, the etching mask 205 is removed.

Figure 2C:
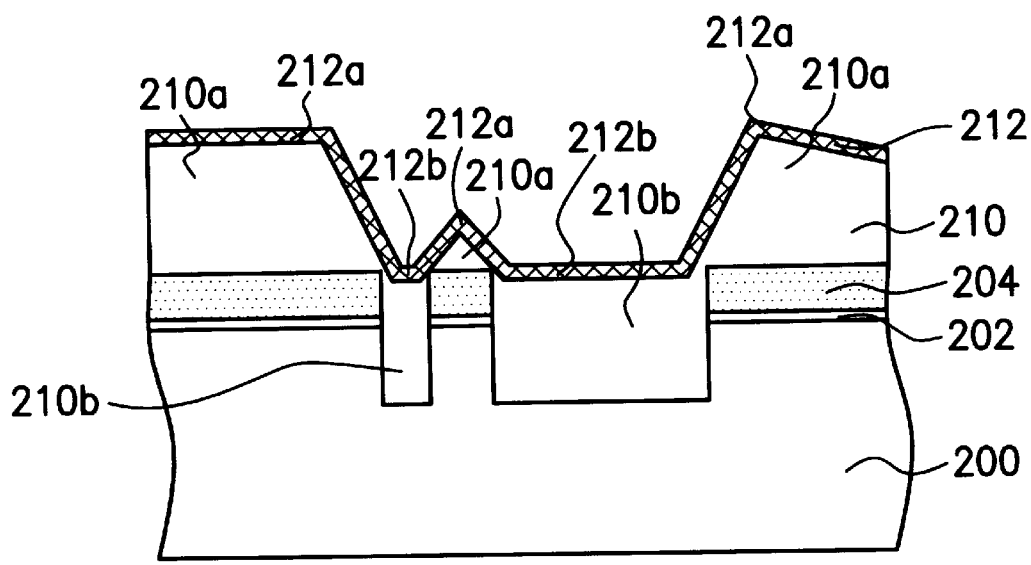

Then, referring to FIG. 2C, an oxide layer 210 is formed over the substrate 200 to cover the mask layer 204 and to fill the trench 206 and the trench 208. Preferably, the oxide layer 210 is formed by using high-density plasma so that the oxide layer 210 is pointed. Especially, a portion 210a of the oxide layer 210 above the mask layer 204 has a level higher than another portion 210b of the oxide layer 210 above the trench 206 and the trench 208. Then, a stop layer 212 is formed over the substrate 200. The stop layer 212 preferably has a thickness of about 300 Å–800 Å. Since the oxide layer 210 which the stop layer 212 is formed on is pointed, the stop layer 212 has an uneven surface. The hardness of the stop layer 212 is higher than that of the oxide layer 210 so that the stop layer 212 has lower polishing speed than the oxide layer 210 during the subsequent CMP process. The stop layer 212 preferably comprises silicon nitride, silicon-oxnitride and boron nitride and is preferably formed by chemical vapor deposition (CVD).

Figure 2D:
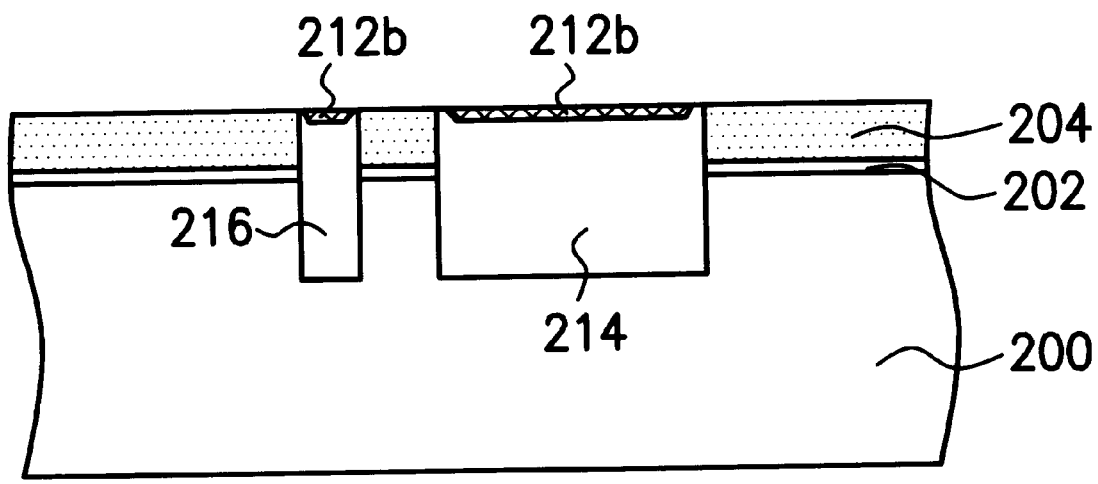

Next, referring to FIG. 2D, preferably a CMP process is performed to remove a portion 212a of the stop layer 212 and a portion 210a of the oxide layer 210 above the mask layer 204; therefore, the oxide layer 214 and the oxide layer 216 are remained in the trench 206 and the trench 208. Since the HDPCVD oxide layer 210 is pointed and the hardness of the stop layer 212 is higher than the oxide layer 210, the protuberance 210a of the oxide layer 210 will be polished away but the oxide layer 212b on the trenches 206, 208 will be remained under the protection of the stop layer 212b. Moreover, the stop layer 212b prevents the formation of scratch on the oxide surface caused by slurry particles during polishing step. Further, even over-polishing is performed to avoid oxide remaining on the mask layer 204, dishing effect will not occur because of the protection of the stop layer 212b.

Figure 2E:
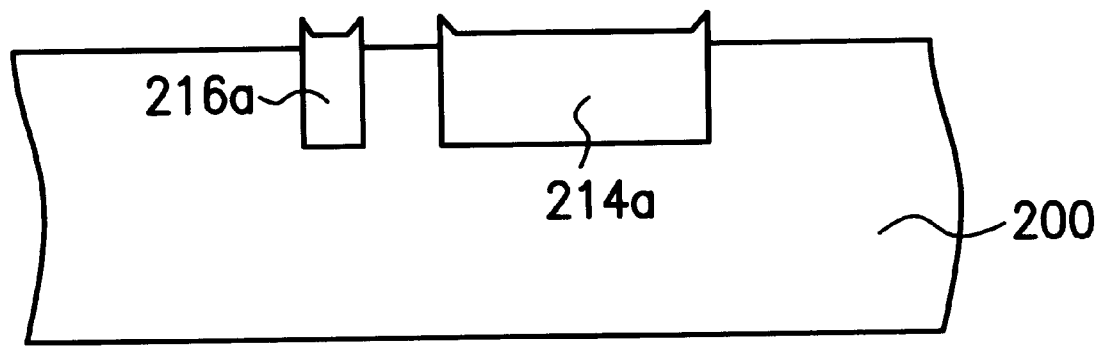

Then, referring to FIG. 2E, the stop layer 212a, the mask layer 204 and the pad oxide layer 202 are removed to form isolation regions 214a and 216a. The stop layer 212b and the mask layer 204 are preferably removed by hot phosphoric acid. Then, hydrofluoric acid erosion is used to remove the pad oxide layer 202 and to form the isolation regions 214a, 216a.

It is therefore that the present invention is characterized by using high-density plasma to form pointed, harder and thicker stop layer. Therefore, dishing effect and microcrack can be avoided.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a shallow trench isolation structure on a substrate, wherein a hard mask is formed on the substrate and a trench is formed in the hard mask and the substrate, comprising:

forming an oxide layer on the substrate to cover the hard mask and to fill the trench by high-density plasma chemical vapor deposition;

forming a stop layer on the oxide layer, wherein the stop layer has a thickness of about 300 Å to 800 Å;

performing a chemical mechanical polishing step to remove a first portion of the stop layer and a first portion of the oxide layer so that the hard mask is exposed, and a second portion of the stop layer and a second portion of the oxide layer over the trench are remained; and removing the hard mask and the stop layer to form an isolation region.

2. A method according to claim 1, wherein the stop layer has a lower polishing speed than the oxide layer during the chemical mechanical polishing step.

3. A method according to claim 2, wherein the stop layer comprises silicon nitride.

4. A method according to claim 2, wherein the stop layer comprises silicon oxy-nitride.

5. A method according to claim 2, wherein the stop layer comprises boron nitride.

6. A method according to claim 1, wherein the stop layer is formed by chemical vapor deposition.

7. A method according to claim 3, wherein the stop layer is formed by chemical vapor deposition.

8. A method according to claim 4, wherein the stop layer is formed by chemical vapor deposition.

9. A method according to claim 3, wherein the stop layer is removed by using phosphoric acid.

10. A method according to claim 1, wherein the hard mask comprises silicon nitride.

11. A method of fabricating a shallow trench isolation structure, comprises:

providing a substrate;

forming a pad oxide layer on the substrate;

forming a silicon nitride layer on the substrate;

patterning the pad oxide layer, the silicon nitride layer and the substrate to form a trench;

depositing an oxide layer on the substrate to cover the hard mask and to fill the trench by using high-density plasma;

forming a stop layer on the oxide layer, wherein the stop layer has a thickness of about 300 Å to 800 Å and the stop layer has a polishing speed lower than the oxide layer;

performing a chemical mechanical polishing step to remove a first portion of the stop layer and a first portion of the oxide layer so that the hard mask is exposed and a second portion of the stop layer and a second portion of the stop layer are remained in the trench; and removing the hard mask, the stop layer and the pad oxide layer.

12. A method according to claim 11, wherein the stop layer comprises silicon nitride.

13. A method according to claim 11, wherein the stop layer comprises silicon oxy-nitride.

14. A method according to claim 11, wherein the stop layer comprises boron nitride.

15. A method according to claim 11, wherein stop layer is formed by chemical vapor deposition.

16. A method according to claim 12, wherein the stop layer is formed by chemical vapor deposition.

17. A method according to claim 13, wherein the stop layer is formed by chemical vapor deposition.

18. A method according to claim 12, wherein the stop layer is removed by using phosphoric acid.

19. A method according to claim 11, wherein the pad oxide layer is removed by using hydrofluoric acid.

* * * * *